United States Patent
Nemouchi et al.

(10) Patent No.: US 12,417,919 B2
(45) Date of Patent: Sep. 16, 2025

(54) METHOD FOR PRODUCING A SUPERCONDUCTING VANADIUM SILICIDE ON A SILICON LAYER

(71) Applicants: Commissariat á l'Energie Atomique et aux Energies Alternatives, Paris (FR); UNIVERSITE GRENOBLE ALPES, Saint Martin d'Heres (FR)

(72) Inventors: Fabrice Nemouchi, Grenoble (FR); Thierry Farjot, Grenoble (FR); Frédéric Gustavo, Grenoble (FR); François Lefloch, Grenoble (FR); Tom Doekle Vethaak, Grenoble (FR)

(73) Assignees: Commissariat a l'Energie Atomique et aux Energies Alternatives, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 484 days.

(21) Appl. No.: 17/823,654

(22) Filed: Aug. 31, 2022

(65) Prior Publication Data
US 2023/0061391 A1      Mar. 2, 2023

(30) Foreign Application Priority Data
Aug. 31, 2021   (FR) ..................... 21 09112

(51) Int. Cl.
*H01L 21/285* (2006.01)
*H10D 64/01* (2025.01)

(52) U.S. Cl.
CPC ....... *H01L 21/28518* (2013.01); *H10D 64/01* (2025.01)

(58) Field of Classification Search
CPC .............. H01L 21/28518; H10D 64/01; H10N 60/0912; H10N 60/128
See application file for complete search history.

(56) References Cited

U.S. PATENT DOCUMENTS

| 4,495,510 A | 1/1985 | Roth et al. |
| 4,663,191 A * | 5/1987 | Choi ................ H01L 21/32134 257/E21.309 |

(Continued)

FOREIGN PATENT DOCUMENTS

| FR | 3 088 483 A1 | 5/2020 |
| JP | 57-153481 A | 9/1982 |
| WO | WO 2009/006679 A1 | 1/2009 |

OTHER PUBLICATIONS

Thin film synthesis of superconductor-on-insulator A15 vanadium silicide, Sci Rep 11 2358 Zhang et al (Year: 2021).*

(Continued)

*Primary Examiner* — Evan G Clinton
*Assistant Examiner* — Corbyn D Mellinger
(74) *Attorney, Agent, or Firm* — Oblon, McClelland, Maier &Neustadt, L.L.P.

(57) ABSTRACT

A method for producing a superconducting vanadium silicide on a silicon layer includes treating a face of the silicon layer in order to prepare it for a deposition of vanadium silicide, then depositing a vanadium silicide layer on the prepared face of the silicon layer in order to obtain a stack of a vanadium silicide layer directly deposited on the silicon layer, then an annealing the stack which increases the critical temperature of the vanadium silicide deposited. The treating includes an operation of incorporation of argon atoms in the silicon layer through the face of the silicon layer.

10 Claims, 3 Drawing Sheets

(56) References Cited

U.S. PATENT DOCUMENTS

| | | | |
|---|---|---|---|
| 5,672,541 A * | 9/1997 | Booske | H01L 21/26526 |
| | | | 438/513 |
| 2020/0161422 A1* | 5/2020 | Nemouchi | H01L 21/324 |
| 2020/0287119 A1 | 9/2020 | Black et al. | |

OTHER PUBLICATIONS

French Preliminary Search Report issued May 13, 2022 in French Application 21 09112, filed on Aug. 31, 2021 (with English Translation of Categories of Cited Documents & Written Opinion), 10 Pages.

Vethaak, T.D. et al., "Influence of Substrate-Induced Thermal Stress on the Superconducting Properties of $V_3Si$ Thin Films", arXiv: 2010.07312v1, 2020, 7 Pages.

Vethaak, T.D. et al., "Superconducting $V_3Si$ for Quantum Circuit Applications", arXiv: 2104.00694v1, 2021, 7 Pages.

Chu, W.K. et al., "Implanted Noble Gas Atoms as Diffusion Markers in Silicide Formation", Thin Solid Films, 25, 1975, 10 Pages.

* cited by examiner

1

METHOD FOR PRODUCING A SUPERCONDUCTING VANADIUM SILICIDE ON A SILICON LAYER

The invention relates to a method for producing a superconducting vanadium silicide on a silicon layer.

In this description, the superconducting vanadium silicide denotes the material for which the chemical formula is $V_3Si$ and not the material for which the chemical formula is $VSi_2$.

Vanadium silicide is one of the superconducting silicides which exhibits the highest critical temperature. This is because its critical temperature can reach 17 K for a bulk material. The critical temperature denotes the temperature of the superconducting material below which its resistivity is zero or virtually zero.

The production of superconducting vanadium silicide as a thin layer on a silicon layer is advantageous in several technical fields, including that of quantum microelectronics and, in particular, in the field of quantum computers. It is notably highly advantageous for the manufacture of Josephson junctions.

For example, Application US2020287119A1 describes a method for the manufacture of a component having a Josephson junction in which electrodes made of superconducting material, such as vanadium silicide, are produced on a silicon layer. To produce electrodes made of superconducting vanadium silicide, this patent application teaches that it is first necessary to deposit a layer of pure vanadium on the silicon layer. Subsequently, the vanadium layer and the silicon layer are heated to a sufficiently high temperature and for a sufficiently long time for the vanadium to be transformed into vanadium silicide. This conversion consumes a portion of the silicon layer.

This method for producing a superconducting vanadium silicide on a silicon layer exhibits several disadvantages. For example, it consumes a great quantity of vanadium. It is more complex and comprises more stages. The deposition of the vanadium layer on the silicon layer is complex. It is difficult to obtain a precise thickness of vanadium silicide or to control an abrupt interface. Furthermore, the vanadium silicide layer is not thermodynamically stable on the silicon. It reacts with the excess silicon to form a $VSi_2$ phase which does not exhibit a superconducting property in the vicinity of 500° C.

The invention is targeted at overcoming at least one of these disadvantages. A subject-matter of the invention is thus a method for producing a superconducting vanadium silicide on a silicon layer. Another subject-matter of the invention is a method for the manufacture of a transistor employing this method for producing a vanadium silicide.

A better understanding of the invention will be obtained on reading the description which will follow, given solely by way of non-limiting example and made with reference to the drawings, in which.

2

Figure 1:
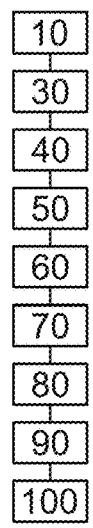
FIG. 1 is a flow chart of a method for the manufacture of a transistor during which a superconducting vanadium silicide is produced on a silicon layer.

In these figures, the same references are used to designate the same elements. In the continuation of this description, the characteristics and functions well known to a person skilled in the art are not described in detail.

In this description, detailed examples of embodiments are first described in Section I with reference to the figures. Subsequently, in Section II, alternative forms of these embodiments are presented. Finally, the advantages of the various embodiments are presented in Section III.

Section I—Embodiment Examples

The method for producing a superconducting vanadium silicide on a silicon layer will now be described in the specific case of a method for the manufacture of a transistor, and more specifically of a Josephson field effect transistor, better known under the acronym JoFET. Such transistors are, for example, used to manufacture quantum computers, SQUIDs (Superconducting QUantum Interference Devices), amplifiers at the quantum limit and others. However, the teaching given in this specific case applies to any other component in which superconducting vanadium silicide has to be produced on a silicon layer. Such examples of other components are given in Section III at the end of this description.

FIGS. 2 to 9 represent different states of manufacture of the transistor. In these figures, the thicknesses of the different layers are not to scale in order to make them easier to read. In these figures, the different layers extend mainly horizontally. The horizontal directions are represented by two directions X and Y of an orthogonal reference point XYZ. The Z direction is the vertical direction. In this instance, the Y direction is perpendicular to the plane of the sheet and has not been represented. Terms such as "upper", "lower", "above", "below" and the like are defined with respect to this Z direction.

Subsequently, the expression "an element made of X" or "element made of X" or "X element" means that at least 90% of the weight of this element and, preferably, at least 95% or 98% of the weight of this element is formed by the material X.

During a stage 10, a gate 12 (FIG. 2) of the transistor is produced on a silicon layer 14. The gate 12 is made from an electrically conductive material or of semiconductor material. In this text, the expression "electrically conductive material" denotes a material, the electrical conductivity of which at 20° C. is greater than $10^2$ S/m and, preferably, greater than $10^5$ S/m. For example, in this instance, the gate 12 is made of polycrystalline silicon which is doped (of n or p type). The gate 12 can also be produced by a stack of metals or of alloy having or not having superconducting properties.

The gate 12 is electrically insulated from the layer 14 by a fine layer 16 made of electrically insulating material. In this text, an electrically insulating material is a material, the electrical conductivity of which at 20° C. is less than $10^{-7}$ or $10^{-11}$ S/m. For example, the layer 16 is made of silicon oxide or of metal oxides having a high permittivity (known under the name of "high k") or of silicate.

The vertical faces of the gate 12 are isolated from the outside by spacers 18, 20. The spacers 18, 20 are made from an electrically insulating material, such as silicon nitride or silicon oxide or a stack of these.

Preferably, the layer 14 is made of monocrystalline silicon. An upper face of this layer 14 is directly in contact with a lower face of the layer 16. The thickness of the layer 14 is generally of between 5 nm and 500 nm and, preferably, of between 5 nm and 50 nm or between 7 nm and 30 nm. The lower face of the layer 14 extends directly over a layer 22 made of electrically insulating material.

The layer 22 is typically made of silicon oxide. Its thickness is for example of between 1 nm and 150 nm. The layer 22 can also be omitted.

The layer 22 rests directly on a support 24 which stiffens the various layers which are stacked above. For example, the thickness of the support 24 is greater than 10 µm and, typically, greater than 500 µm or 700 µm. In this instance, this support 24 is made of silicon, such as monocrystalline, amorphous or polycrystalline silicon. Typically, the support 24 and the layers 22 and 14 correspond to the three layers of an SOI ("Silicon On Insulator") substrate.

Figure 2:
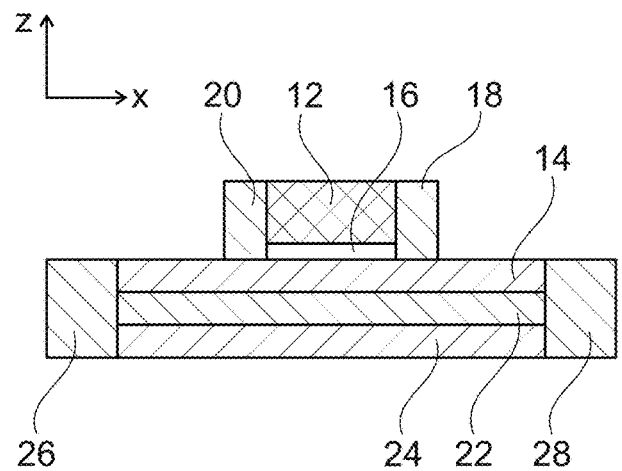
FIGS. 2 to 9 are diagrammatic illustrations, in vertical cross section, of various states of manufacture of the transistor during the implementation of the method of FIG. 1.

In order to isolate the transistor from the other transistors manufactured in parallel on the same support 24, deep isolation trenches 26 and 28 are produced around the transistor to be manufactured. These trenches 26 and 28 are known under the acronym STI ("Shallow Trench Isolation"). They are made from an electrically insulating material, such as silicon oxide or silicon nitride and silicon oxide. The depth of the trenches 26 and 28 is typically of the order of 250 nm. Thus, the depth of these trenches is generally between 200 nm and 300 nm. The term "depth of the trenches 26 and 28" denotes in this instance the greatest dimension of the trenches 26 and 28 in a direction perpendicular to the plane in which the support 24 mainly extends. The various stages for obtaining, starting from an SOI substrate, the state represented in FIG. 2 are known. Thus, stage 10 is not described here in more detail.

During a stage 30, a layer 32 (FIG. 3) of electrically insulating material is deposited on the upper face of the layer 14 in order to completely encapsulate the gate 12 inside this layer 32. In this instance, the layer 32 is made of silicon oxide.

Figure 3:
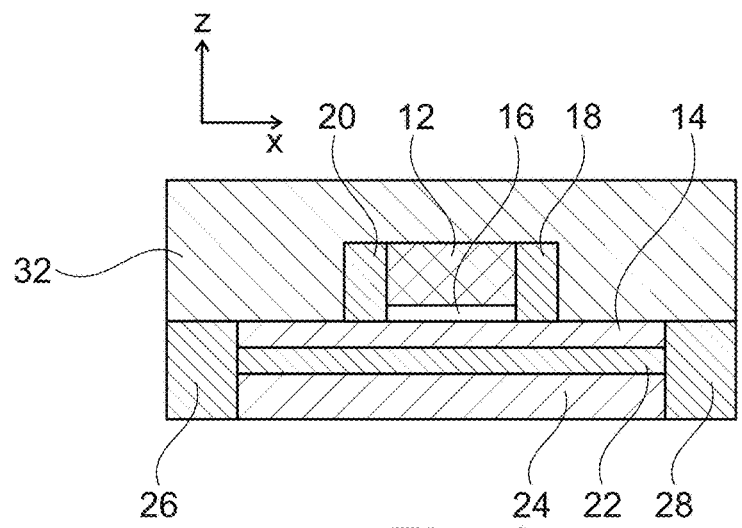
Figure 4:
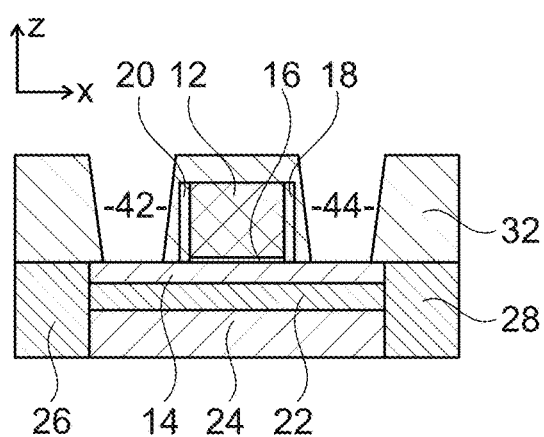

Subsequently, the upper face of the layer 32 is polished in order to obtain the state represented in FIG. 3. For example, the polishing method employed is a chemical-mechanical polishing method known under the acronym CMP.

During a stage 40, holes 42 and 44 (FIG. 4) are hollowed out on either side of the gate 12 at the places where the electrodes of the transistor have to be produced. In the case of a JoFET transistor, these electrodes are, respectively, the drain and the source. The holes 42 and 44 each emerge directly on the upper face of the layer 14. Thus, a part of the upper face of the layer 14 is exposed via these holes 42, 44.

During a stage 50, a treatment of the exposed upper face of the layer 14 is carried out in order to prepare it to receive a deposition of vanadium silicide. In this instance, the preparation of the exposed upper face of the layer 14 consists in incorporating argon atoms 52 (FIG. 5) at the surface of this layer 14, and also in cleaning the upper face of this layer in order, notably, to deoxidize it.

Figure 5:
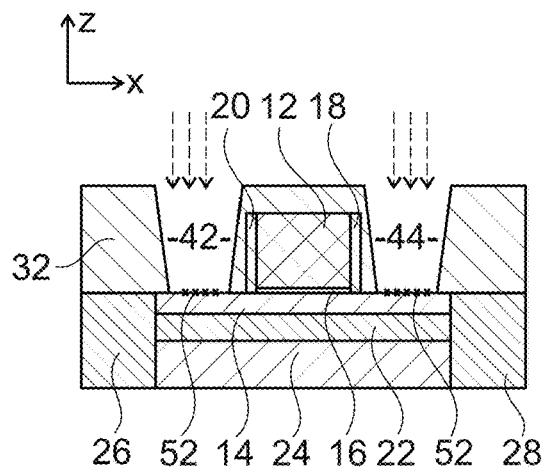
Figure 6:
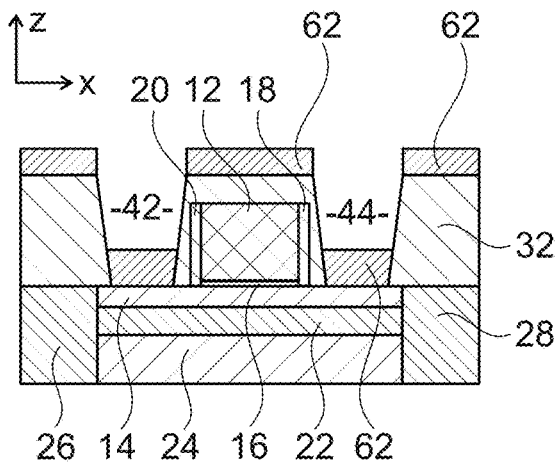
Figure 7:
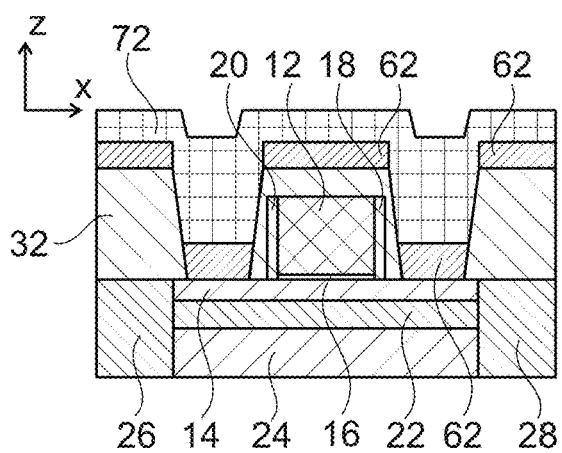

In FIG. 5, the argon atoms incorporated in the layer 14 are represented by crosses and denoted by the same common reference 52. The majority of the argon atoms incorporated in the layer 14 are located at less than 10 nm and, preferably at less than 5 nm from the upper face of the layer 14. They are thus located inside a region which corresponds to a fine surface layer of less than 10 nm and preferably of less than 5 nm in thickness. The thickness of this fine surface layer is also generally greater than 1 nm. Advantageously, 70% or 80% or even 90% by weight of the argon atoms incorporated in the layer 14 are located inside this fine surface layer. The concentration of argon atoms incorporated in this fine surface layer is between 1 atom % and 10 atom % and preferably between 2 atom % and 5 atom %. The expression "X atom %" means that the number of argon atoms inside the fine surface layer represents X % of the total number of atoms present in this surface layer. Subsequently, the term "at the surface of the layer 14" denotes the fine surface layer of the layer 14. The expression "to incorporate argon atoms at the surface of the layer 14" means to incorporate the argon atoms inside the fine surface layer with a concentration within the preceding concentration ranges.

In this instance, in order to incorporate the argon atoms at the surface of the layer 14 and at the same time to clean the exposed upper face, the upper face of the transistor in the course of manufacture is subjected to an argon plasma cleaning operation. During this operation, the upper face is directly exposed to an argon plasma. This plasma comprises argon ions. The transistor and the plasma are at different potentials so that the argon ions are projected onto the upper face of the layer 14. These projected argon ions then slightly penetrate inside the layer 14 and are then transformed into argon atoms. In FIG. 5, the projection of the argon ions onto the upper face of the layer 14 is represented by vertical dotted arrows.

In order to regulate the amount of argon ions projected onto the exposed upper face of the layer 14, there exist mainly two parameters to be regulated for a given difference in potentials:

the partial argon pressure in the plasma, and
the power of the generator necessary to obtain the plasma.

The partial pressure can be regulated by adjusting the flow rate of argon gas entering and departing from the reservoir containing the argon plasma.

The concentration of argon ions in the plasma can be adjusted by modifying the power of the alternating current which circulates in an antenna which transforms this alternating current into an alternating electric field present inside the reservoir. It is this alternating electric field which transforms the inert argon gas into argon plasma. This power is known under the term of "RF power". In this instance, the partial pressure and the RF power are regulated in order to obtain the desired concentration of argon atoms inside the fine surface layer of the layer 14.

By way of example, a CT200 device produced by Alliance Concept® was used. In order to obtain the desired concentration of argon atoms at the surface of the layer 14 with this device, the partial pressure is chosen between 0.001 mbar (0.1 Pa) and 0.15 mbar (15 Pa) and the RF power is chosen between 100 W and 400 W. For example, a pressure equal to 0.05 mbar (5 Pa) and an RF power equal to 200 W were used to obtain the vanadium silicide layer represented in FIG. 10.

During a stage 60, a layer 62 of vanadium silicide is deposited on the upper face of the transistor in the course of manufacture. Once deposited, this layer 62 covers mainly the portions of the upper face of the transistor which extend horizontally. In particular, the layer 62 covers the bottom of the holes 42 and 44. Thus, at the bottom of each hole 42 and 44, there is obtained a stack of a vanadium silicide layer directly deposited on the silicon layer 14. The thickness of the layer 62 is of between 5 nm and 400 nm and, preferably, between 5 nm and 100 nm or between 5 nm and 60 nm.

In this instance, the deposition of vanadium silicide is carried out according to the physical vapour deposition method known under the acronym PVD. For example, for this, a vanadium silicide target is bombarded with argon ions, which tears off atoms at the target. The atoms thus torn off will subsequently be deposited on the upper face of the transistor in the course of manufacture. The layer 62 is thus deposited gradually.

At this stage, the deposited layer 62 is amorphous or only partially crystalline. Thus, at this stage, the vanadium silicide is not yet superconducting or its critical temperature is low and can still be improved.

During a stage 70, a metal layer 72 (FIG. 7) is deposited in order to completely fill the holes 42 and 44. For example, the layer 72 is made of tungsten.

Figure 8:
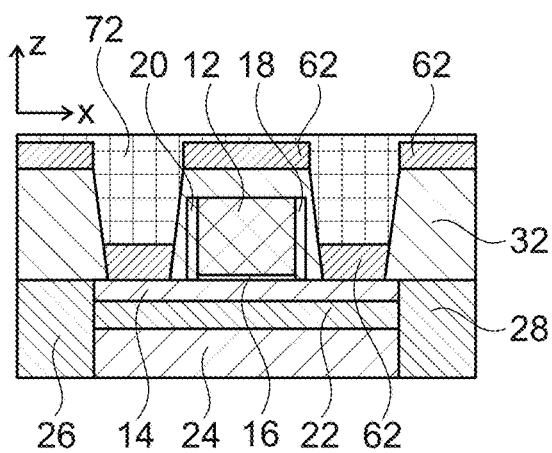

During a stage 80, the upper face of the layer 72 is polished in order to obtain a flat upper face (FIG. 8). This polishing is halted before reaching the layer 62. For example, it is a simple mechanical polishing.

Figure 9:
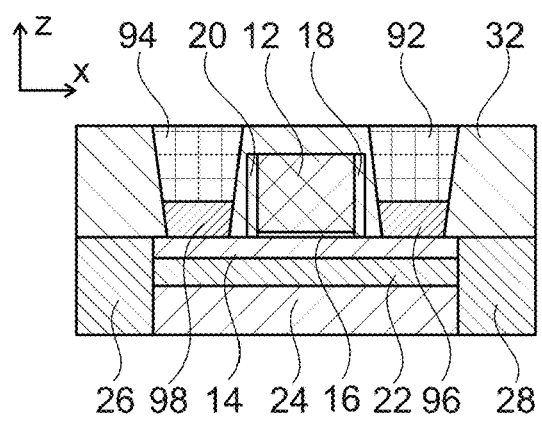

During a stage 90, a further polishing is carried out. This polishing is halted when the layer 32 is reached (FIG. 9). This polishing thus removes the portions of the layers 62 and 72 which are found outside the holes 42 and 44. Two metal pads 92 and 94, a drain 96 made of vanadium silicide and a source 98 made of vanadium silicide are thus obtained. The drain 96 and the source 98 are each formed by a remaining portion of the layer 62 located at the bottom of the holes, respectively, 44 and 42. The drain 96 and the source 98 are electrically connected to one another by a portion of the silicon layer 14 referred to as "channel". The pads 92 and 94 electrically connect, respectively, the drain 96 and the source 98 to an upper face of the transistor.

During a stage 100, an annealing, also called in this instance "heat treatment", is applied in order to heat the vanadium silicide deposited and to thus increase its critical temperature in order, typically, to obtain a critical temperature of greater than 10 K and, preferably, of greater than 15 K or 16 K or 17 K. For this, this heat treatment crystallizes the vanadium silicide deposited during stage 60.

This heat treatment consists in placing the transistor in an oven preheated to a predetermined temperature or in an oven which is not preheated and which is then brought to a temperature TF of between 200° C. and 1100° C. and, preferably, of between 500° C. and 900° C.

Subsequently, the transistor is left in this oven for a period of time DF of between 10 s and 15 min and, preferentially, of between 10 s and 5 min and more preferentially still of between 10 s and 120 s or between 30 s and 60 s. Typically, the higher the temperature TF, the more the period of time DF can be reduced. However, an excessively high temperature TF can damage or modify other layers of the transistor, such as the support 24. Thus, an acceptable compromise has to be found between a high temperature TF and a short period of time DF. An acceptable compromise is, for example, to choose the temperature TF between 500° C. and 900° C. and the period of time DF between 30 s and 60 s.

For example, during stage 100, the heat treatment is a rapid thermal annealing, better known under the acronym RTA.

Figure 10:
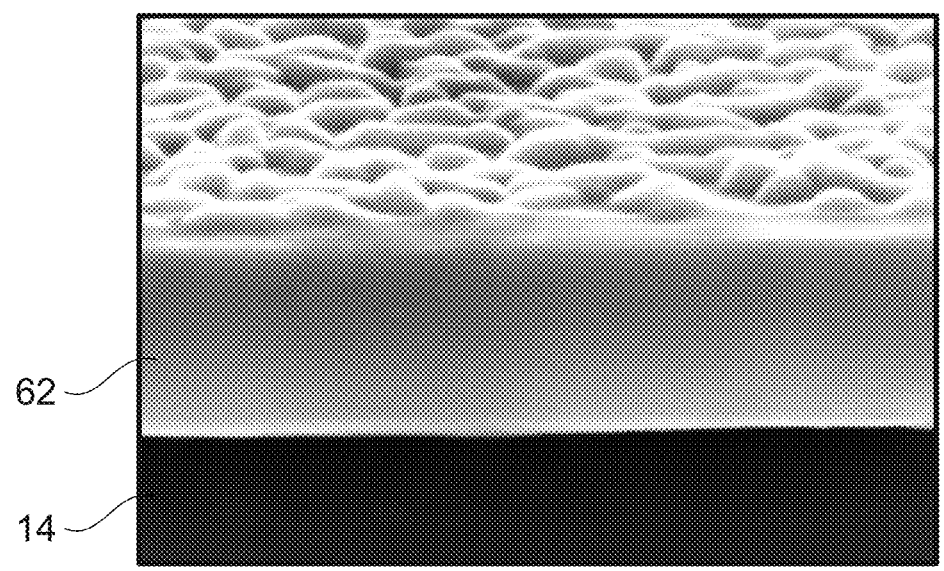
FIG. 10 is an image of a cross section of the vanadium silicide obtained according to the main stages of the method of FIG. 1.

FIG. 10 represents a view in cross section of the layer 62 on the layer 14 obtained during a test carried out by employing only stages 50, 60 and 100 of the method of FIG. 1. The thickness of the layer 62 is approximately 100 nm in this test.

Figure 11:
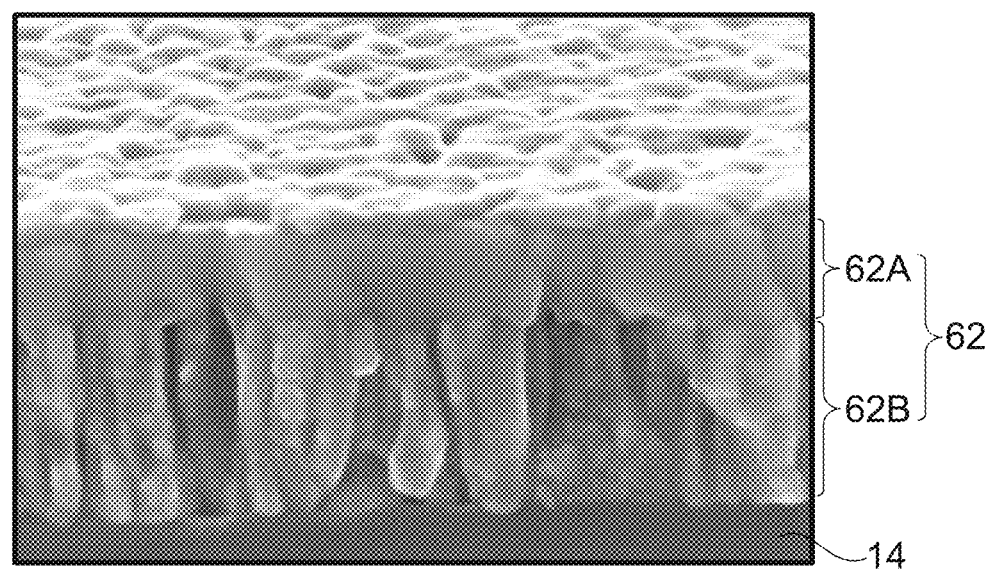
FIG. 11 is an image of a cross section of vanadium silicide obtained according to an alternative method to that employed for producing the vanadium silicide of FIG. 10.

FIG. 11 represents an image in cross section of the layer 62 on the layer 14 obtained during a test carried out by employing the same method as that employed in order to obtain the layer 62 of FIG. 10, except that stage 60 has been replaced by a simple stage of cleaning the face of the layer 14 with hydrofluoric acid. Thus, unlike the method of FIG. 1, no argon atom is incorporated at the surface of the layer 14 before the deposition of the vanadium silicide. In this case, in the absence of an argon atom incorporated at the surface of the layer 14, during the heat treatment stage 100, the lower part 62B of the layer 62 reacts with the silicon of the layer 14. In this lower part, the heat treatment of stage 100 transforms the vanadium silicide into vanadium disilicide, that is to say into a component having the chemical formula $VSi_2$. The upper part 62A of the layer 62 for its part remains made of vanadium silicide with the composition $V_3Si$. The problem encountered is that $VSi_2$ is not a superconducting material. Thus, the upper part 62A is separated from the layer 14 by a non-superconducting material, which very greatly damages the performance qualities of the device manufactured.

Conversely, when argon atoms are incorporated at the surface of the layer 14, during stage 100, no detectable transformation of vanadium silicide to give $VSi_2$ takes place. In the latter case, the produced layer made of superconducting vanadium silicide is clearly directly in contact with the layer 14. This is important, for example, in order to obtain a good Josephson junction.

Section II—Alternative Forms

Other embodiments of the layer 32 are possible. For example, in an alternative form, the layer 32 is formed of a silicon nitride sublayer and of a silicon oxide sublayer. The silicon nitride sublayer is found under the silicon oxide sublayer. It is thus notably interposed between the layer 14 and the silicon oxide sublayer. The silicon nitride sublayer is used to control the depth of the holes 42 and 44 which are hollowed out subsequently mainly in the silicon oxide sublayer, for example by plasma etching. In the latter case, the silicon nitride sublayer is known under the acronym CESL (Contact Etch Stop Layer).

Other plasma devices than that used by the Applicant Company may be suitable for incorporating argon atoms at the surface of the layer 14. In the case where another device is used, the latter has to be regulated in order to obtain the desired concentration of argon atoms at the surface of the layer 14. For example, such a regulation can be determined experimentally by measuring, for different regulations tried out, each time the concentration of argon atoms at the surface of the layer 14. For example, the concentration of argon atoms at the surface of the layer 14 can be measured by emission spectrometry and, in particular, by inductively coupled plasma mass spectrometry, better known under the acronym ICP-MS. The concentration of argon atoms can also be measured by other appropriate methods, such as X-ray photoelectron spectrometry, better known under the acronym XPS.

Advantageously, the operation of treatment of the upper face of the layer 14 with an argon plasma is preceded by an operation of cleaning this upper face with hydrofluoric acid.

Other methods are possible for incorporating argon atoms at the surface of the silicon layer 14. For example, in another embodiment, the same method as that used to implant dopants in a semiconductor material is used to implant argon atoms. In this case, the argon atoms are first ionized. Subsequently, the argon ions obtained are accelerated by an electric field and then projected onto the upper face of the layer 14. The energy of the argon ions is regulated in order for the majority of these ions not to sink by more than 5 nm or than 10 nm inside the silicon layer. Thus, by way of example, the energy of the argon ions is between 5 and 15 keV. The dose necessary to obtain an atomic concentration of argon of between 1 atom % and 10 atom % is between $9 \times 10^{14}$ and $9 \times 10^{15}$ ions per square centimetre. In a specific example, the dose necessary to obtain an atomic concentration of argon of 4 atom % is $3.6 \times 10^{15}$ ions per square centimetre under an energy of 10 keV. Once implanted in the silicon layer, the argon ions again become neutral argon atoms. Preferably, in this case, after the implantation of the argon atoms in the silicon layer, an operation of cleaning the upper face of the silicon layer is carried out in order to finalize its preparation for the deposition of the vanadium silicide. The aim of this cleaning is notably to deoxidize the upper face of the silicon layer. For example, it is an HF cleaning, that is to say a cleaning with hydrofluoric acid, or a cleaning with helium or argon plasma. When the argon plasma is only used to clean the face of the silicon layer, the partial pressure and the RF power do not need to be regulated as described above to incorporate argon atoms inside the silicon layer 14. For example, the argon partial pressure and/or the RF power are much lower.

To incorporate argon atoms at the surface of the silicon layer 14, it is also possible to expose the upper face of this layer to a neutral argon gas so that argon atoms are adsorbed on this upper face. Subsequently, a heat treatment is applied in order to cause the adsorbed argon atoms to diffuse inside the silicon layer.

Other methods than the PVD method are possible to deposit the vanadium silicide on the layer 14. For example, the vanadium silicide can also be deposited on the layer 14 by other vapour deposition methods, such as the chemical vapour deposition method, better known under the acronym CVD. The vanadium silicide can also be deposited by employing an electrochemical deposition method.

The method for producing the superconducting vanadium silicide on a silicon layer can be carried out in other contexts than that of the manufacture of a JoFET transistor. For example, it can also be employed to manufacture a transistor which does not comprise a Josephson junction. It can also be employed to manufacture components which are not transistors, such as, for example, the component described with reference to FIG. 4 in Application US2020287119A1.

The method described can also be employed to manufacture components in which the upper face of the silicon layer directly in contact with the superconducting vanadium silicide is a vertical face and not a horizontal face. For example, the method described here can be employed to manufacture a component such as that described with reference to FIG. 3 or 5 of Application US2020287119A1. In this case, the silicon layer is deposited first on the oxide layer. Subsequently, this silicon layer is structured, typically by etching, in order to obtain a silicon channel having the desired shape. Preferably, an additional layer is formed on the horizontal upper face of the silicon channel in order to act as stop layer for the polishing subsequently carried out in order to remove the excess vanadium silicide deposited. The vertical faces of the silicon channel are exposed to the argon plasma as described above. The vanadium silicide is subsequently deposited to come into contact with the vertical faces of the silicon channel. The excess vanadium silicide which is found on the silicon channel is subsequently removed, for example with the help of chemical-mechanical polishing and by using the additional layer as stop layer for this polishing. Finally, the heat treatment of stage 100 is applied to improve the critical temperature of the vanadium silicide deposited.

In an alternative form, stage 100 can be carried out at another time. For example, the heat treatment can also be carried out immediately after stage 60 and before stage 70 or before stage 80 or before stage 90.

Section III—Advantages of the Embodiments Described

The fact of directly depositing vanadium silicide on the silicon layer is advantageous in comparison with the method which deposits only vanadium on the silicon layer and then which subsequently transforms this deposited vanadium into vanadium silicide with the help of a heat treatment. In particular, the production method described here prevents or very greatly limits the appearance of $VSi_2$ at the interface between the silicon and the vanadium silicide. The method described here also makes it possible to deposit vanadium and silicon in the desired stoichiometric proportions in order to obtain vanadium silicide. There is thus less waste of matter, such as, for example, an excessively great deposition of vanadium. Furthermore, the deposition of vanadium silicide is simpler to carry out than the deposition of pure vanadium because vanadium silicide is less sensitive to oxidation and to nitridation in the case where it would be desired to encapsulate it with a nitride. The heat treatment applied during stage 100 of the method described here to increase the critical temperature of the vanadium silicide takes place at a temperature which is generally lower than that necessary to cause pure vanadium deposited on the silicon layer to react in order to obtain vanadium silicide. Furthermore, the duration of this heat treatment is shorter. Finally, it is easier to control the thickness of vanadium silicide deposited by employing the method described here than in the case where the vanadium silicide is obtained by a chemical reaction between pure vanadium and a silicon layer. This is because this chemical reaction consumes a portion of the silicon layer and thus modifies the thickness of the vanadium layer.

The use of an argon plasma makes it possible, in a single operation, to clean the upper face of the silicon layer 14 to prepare it for the deposition of vanadium silicide and, at the same time, to incorporate the argon atoms at the surface of this silicon layer.

The deposition of vanadium silicide by the PVD method is simple to carry out.

The invention claimed is:

1. A method for producing a superconducting vanadium silicide on a silicon layer, comprising:
    treating a face of the silicon layer in order to prepare the face for a deposition of vanadium silicide, then
    depositing a vanadium silicide layer on the prepared face of the silicon layer in order to obtain a stack of a vanadium silicide layer directly deposited on the silicon layer, then
    annealing the stack which increases a critical temperature of the vanadium silicide deposited,
    wherein the treating comprises an operation of incorporation of argon atoms in the silicon layer to a desired concentration through the face of the silicon layer and the vanadium silicide layer is deposited on the silicon layer having the argon atoms incorporated at the desired concentration, and
    wherein the incorporation operation generates, inside the silicon layer, a region inside which a concentration of argon atoms is between 1 atom % and 10 atom %.

2. The method according to claim 1, wherein the incorporation operation comprises exposure of the face of the silicon layer to a plasma of argon ions.

3. The method according to claim 1, in which said region is a fine surface layer extending from the prepared face of the silicon layer down to a depth of less than 10 nm.

4. The method according to claim 1, wherein the vanadium silicide layer is deposited on the face of the silicon layer by a deposition method chosen from the group consisting of a vapour deposition and an electrochemical deposition.

5. The method according to claim 4, wherein the deposition method is a physical vapour deposition method.

6. The method according to claim 1, wherein the annealing of the stack is performed at a temperature between 500° C. and 900° C.

7. The method according to claim 6, wherein a duration of the annealing is between 10 s and 5 min.

8. The method according to claim 1, wherein the vanadium silicide is $V_3Si$.

9. A method for manufacturing a transistor, comprising:
producing a silicon layer, then
producing a first and a second electrode made of superconducting vanadium silicide, each of the first and second electrodes having a face directly in contact with a corresponding face of the silicon layer and being electrically connected to one another via a channel formed in the silicon layer,
wherein producing each of the first and second electrodes comprises producing a superconducting vanadium silicide on the silicon layer by employing a method according to claim 1.

10. The method according to claim 9, comprising producing a control gate above the channel formed in the silicon layer.

* * * * *